United States Patent
Kumar et al.

(10) Patent No.: US 9,465,898 B2
(45) Date of Patent: Oct. 11, 2016

(54) LOOP HANDLING IN A WORD-LEVEL NETLIST

(71) Applicant: Mentor Graphics Corporation, Wilsonville, OR (US)

(72) Inventors: Sunil Kumar, San Jose, CA (US); Noam Farkash, Mountain View, CA (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 14/608,603

(22) Filed: Jan. 29, 2015

(65) Prior Publication Data

US 2016/0224710 A1 Aug. 4, 2016

(51) Int. Cl.
*G06F 17/50* (2006.01)

(52) U.S. Cl.
CPC ....... *G06F 17/5045* (2013.01); *G06F 17/5081* (2013.01)

(58) Field of Classification Search
CPC .................................................. G06F 17/5031
USPC ........................................................ 716/103
See application file for complete search history.

(56) References Cited

U.S. PATENT DOCUMENTS

| | | | |
|---|---|---|---|
| 8,122,401 B1* | 2/2012 | Chauhan et al. | 716/107 |
| 2010/0077366 A1* | 3/2010 | Bjesse | 716/5 |
| 2010/0107131 A1* | 4/2010 | Bjesse | 716/5 |
| 2010/0107132 A1* | 4/2010 | Bjesse | 716/5 |

* cited by examiner

*Primary Examiner* — Suchin Parihar
(74) *Attorney, Agent, or Firm* — Mentor Graphics Corporation

(57) ABSTRACT

This application discloses an electronic design automation tool configured to identify combinational loops in a word-level netlist, and then modify the word-level netlist based on the presence of the combinational loops. The electronic design automation tool can analyze the word-level netlist to identify a portion of the word-level netlist having at least one characteristic associated with a combinational loop, translate the identified portion of the word-level netlist into a bit-level circuit representation, and utilize the bit-level circuit representation to determine whether the identified portion of the word-level netlist implements the combinational loop. The electronic design automation tool can modify the word-level netlist by replacing the identified combination loop in the word-level netlist with a description of a different circuit, such as a loop buffer, or annotate the presence of the identified combinational loop in the word-level netlist.

20 Claims, 8 Drawing Sheets

LOOP HANDLING IN A WORD-LEVEL NETLIST

TECHNICAL FIELD

This application is generally related to electronic design automation and, more specifically, to loop handling in a word-level netlist.

BACKGROUND

Microdevices, such as integrated microcircuits and microelectromechanical systems (MEMS), are used in a variety of products, from automobiles to microwaves to personal computers. Designing and fabricating microdevices typically involves many steps, known as a "design flow." The particular steps of a design flow often are dependent upon the type of microcircuit, its complexity, the design team, and the microdevice fabricator or foundry that will manufacture the microcircuit. Typically, software and hardware "tools" verify the design at various stages of the design flow by running software simulators and/or hardware emulators, and errors in the design are corrected or the design is otherwise improved.

Several steps are common to most design flows for integrated microcircuits. Initially, the specification for a new circuit is transformed into a logical design, sometimes referred to as a register transfer level (RTL) description of the circuit. With this logical design, the circuit can be described in terms of both the exchange of signals between hardware registers and the logical operations that can be performed on those signals. The logical design typically employs a Hardware Design Language (HDL), such as the Very high speed integrated circuit Hardware Design Language (VHDL). As part of the creation of a logical design, a designer will also implement a place-and-route process to determine the placement of the various portions of the circuit, along with an initial routing of interconnections between those portions. The logic of the circuit is then analyzed, to confirm that it will accurately perform the functions desired for the circuit. This analysis is sometimes referred to as "functional verification."

Various electronic design automation tools can perform verification checks on the logical design. For example, a clock-domain tool can analyze the logical design to determine whether interaction between different clock domains in the logical design can cause glitches, e.g., due to signal meta-stability, which may lead to system failure. The clock-domain tool typically converts or synthesizes the logical design into a device design, for example, in the form of a word-level netlist, and performs one or more static checks on the word-level netlist. Some of the static checks can traverse the word-level netlist to identify locations of clock domain crossing points and determine whether the logical design includes adequate protection circuitry, such as synchronizers, at the identified locations to synchronize signal exchanges between the clock domains. The clock-domain tool can further augment the static checks with other verification processes, such as formal verification, simulation, emulation, or the like, for example, to verify operability of transfer protocols between clock domains, to identify delays through protection circuitry due to meta-stability, or the like.

While the clock-domain tool can effectively verify clock domain crossings of logical designs, the duration of and the resources consumed during the static check can vary based on the specific coding of the logical designs provided to the clock-domain tool. For example, when a logical design includes cyclical assignment of instances, the clock-domain tool typically synthesizes or converts those cyclical assignments into combinational loops in a corresponding word-level netlist. Since traversal of the combinational loops by the clock-domain tool is onerous, often requiring intensive non-linear computation to traverse correctly, the more combinational loops that are present in the word-level netlist, the longer and more resource intensive netlist traversal becomes. This problem can be exacerbated when the clock-domain tool implements a hierarchical verification scheme for clock domain crossings, for example, sub-dividing the word-level netlist into various levels of abstraction, such as block-level verification, top-level verification, localized verification, or the like, each of which performs a separate netlist traversal.

SUMMARY

This application discloses tools and mechanisms for handling loops in an expression netlist representation of a circuit design. According to various embodiments, the tools and mechanisms can identify combinational loops in a word-level netlist, and then modify the word-level netlist based on the presence of the combinational loops. The tools and mechanisms can identify one of the combinational loops in the word-level netlist, for example, by analyzing the word-level netlist to identify a portion of the word-level netlist having at least one characteristic associated with a combinational loop, translating the identified portion of the word-level netlist into a bit-level circuit representation, and utilizing the bit-level circuit representation to determine whether the identified portion of the word-level netlist implements the combinational loop. The tools and mechanisms can modify the word-level netlist, for example, by replacing the identified combination loop in the word-level netlist with a description of a different circuit, such as a loop buffer, or annotate the presence of the identified combinational loop in the word-level netlist.

DETAILED DESCRIPTION

Illustrative Operating Environment

The execution of various electronic design automation processes according to embodiments of the invention may be implemented using computer-executable software instructions executed by one or more programmable computing devices. Because these embodiments of the invention may be implemented using software instructions, the components and operation of a generic programmable computer system on which various embodiments of the invention may be employed will first be described. Further, because of the complexity of some electronic design automation processes and the large size of many circuit designs, various electronic design automation tools are configured to operate on a computing system capable of simultaneously running multiple processing threads.

Figure 1:
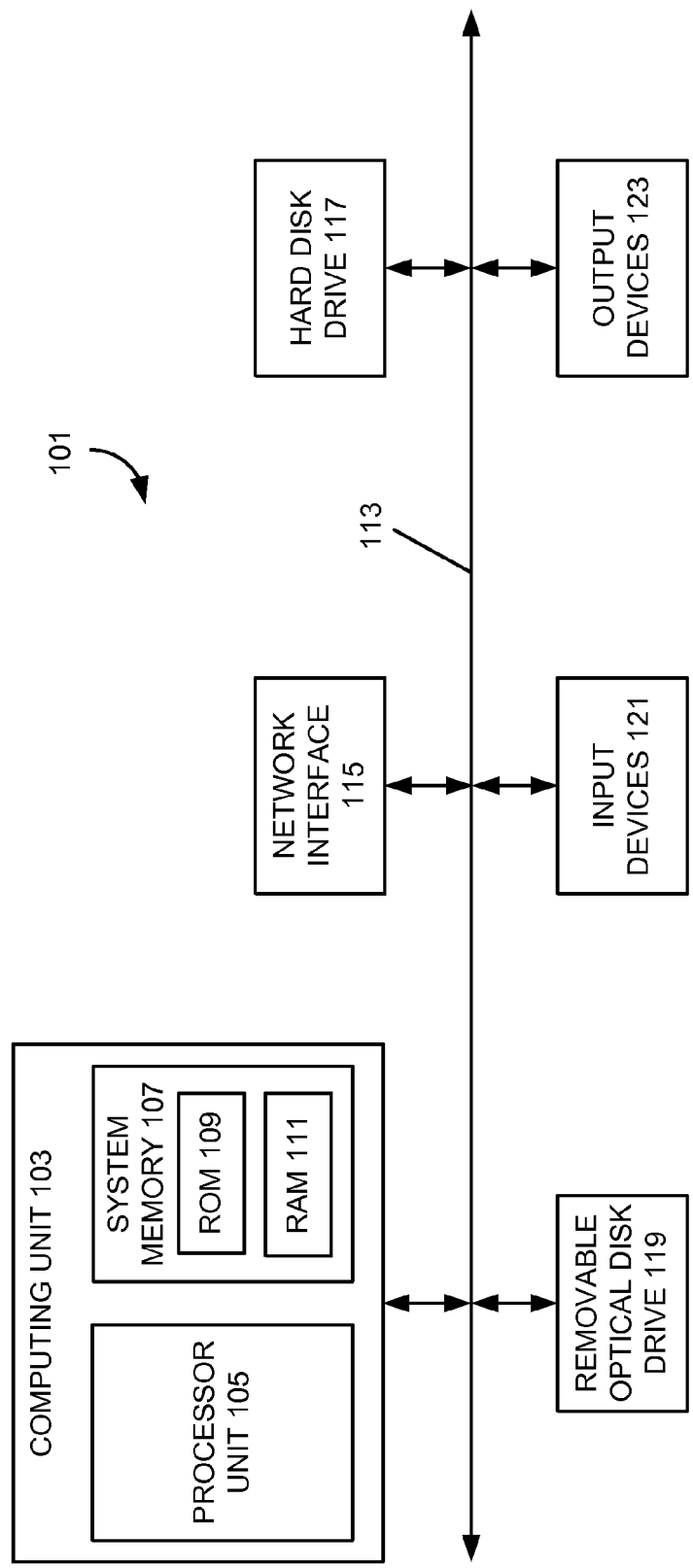
FIGS. 1 and 2 illustrate an example of a computer system of the type that may be used to implement various embodiments of the invention.

Various examples of the invention may be implemented through the execution of software instructions by a computing device, such as a programmable computer. Accordingly, FIG. 1 shows an illustrative example of a computing device 101. As seen in this figure, the computing device 101 includes a computing unit 103 with a processing unit 105 and a system memory 107. The processing unit 105 may be any type of programmable electronic device for executing software instructions, but will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices. For example, the processing unit 105 or the system memory 107 may be directly or indirectly connected to one or more additional memory storage devices, such as a "hard" magnetic disk drive 115, a removable magnetic disk drive 117, an optical disk drive 119, or a flash memory card 121. The processing unit 105 and the system memory 107 also may be directly or indirectly connected to one or more input devices 123 and one or more output devices 125. The input devices 123 may include, for example, a keyboard, a pointing device (such as a mouse, touchpad, stylus, trackball, or joystick), a scanner, a camera, and a microphone. The output devices 125 may include, for example, a monitor display, a printer and speakers. With various examples of the computer 101, one or more of the peripheral devices 115-125 may be internally housed with the computing unit 103. Alternately, one or more of the peripheral devices 115-125 may be external to the housing for the computing unit 103 and connected to the bus 113 through, for example, a Universal Serial Bus (USB) connection.

With some implementations, the computing unit 103 may be directly or indirectly connected to one or more network interfaces 127 for communicating with other devices making up a network. The network interface 127 translates data and control signals from the computing unit 103 into network messages according to one or more communication protocols, such as the transmission control protocol (TCP) and the Internet protocol (IP). Also, the interface 127 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 101 is illustrated as an example only, and it not intended to be limiting. Various embodiments of the invention may be implemented using one or more computing devices that include the components of the computer 101 illustrated in FIG. 1, which include only a subset of the components illustrated in FIG. 1, or which include an alternate combination of components, including components that are not shown in FIG. 1. For example, various embodiments of the invention may be implemented using a multi-processor computer, a plurality of single and/or multiprocessor computers arranged into a network, or some combination of both.

Figure 2:
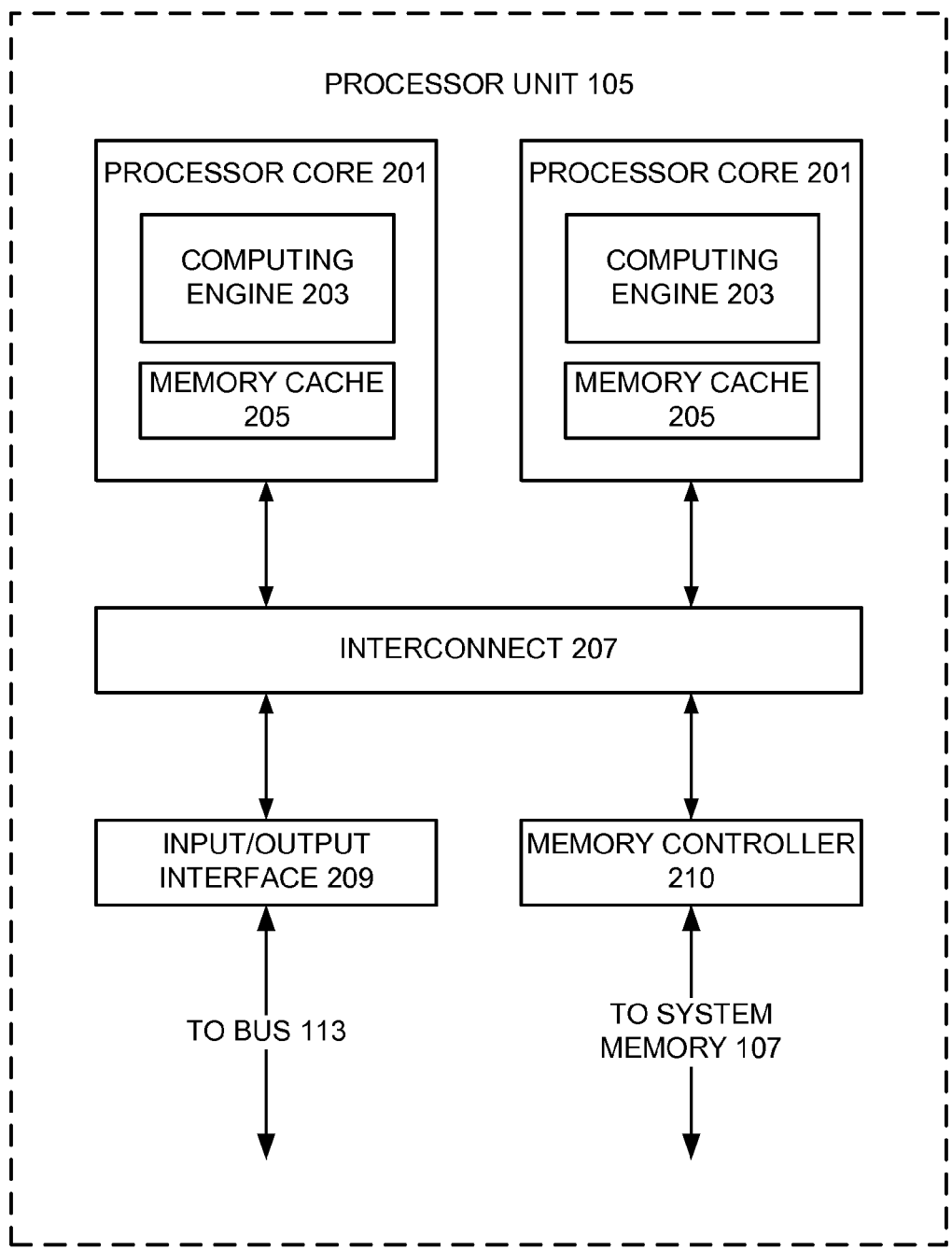

With some implementations of the invention, the processor unit 105 can have more than one processor core. Accordingly, FIG. 2 illustrates an example of a multi-core processor unit 105 that may be employed with various embodiments of the invention. As seen in this figure, the processor unit 105 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 201. With some processor cores 201, such as the Cell microprocessor created by Sony Corporation, Toshiba Corporation and IBM Corporation, the interconnect 207 may be implemented as an interconnect bus. With other processor units 201, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 211. The input/output interface 209 provides a communication interface between the processor unit 201 and the bus 113. Similarly, the memory controller 211 controls the exchange of information between the processor unit 201 and the system memory 107. With some implementations of the invention, the processor units 201 may include additional components, such as a high-level cache memory accessible shared by the processor cores 201.

It also should be appreciated that the description of the computer network illustrated in FIG. 1 and FIG. 2 is provided as an example only, and it not intended to suggest any limitation as to the scope of use or functionality of alternate embodiments of the invention.

Loop Handling in a Word-Level Netlist

Figure 3:
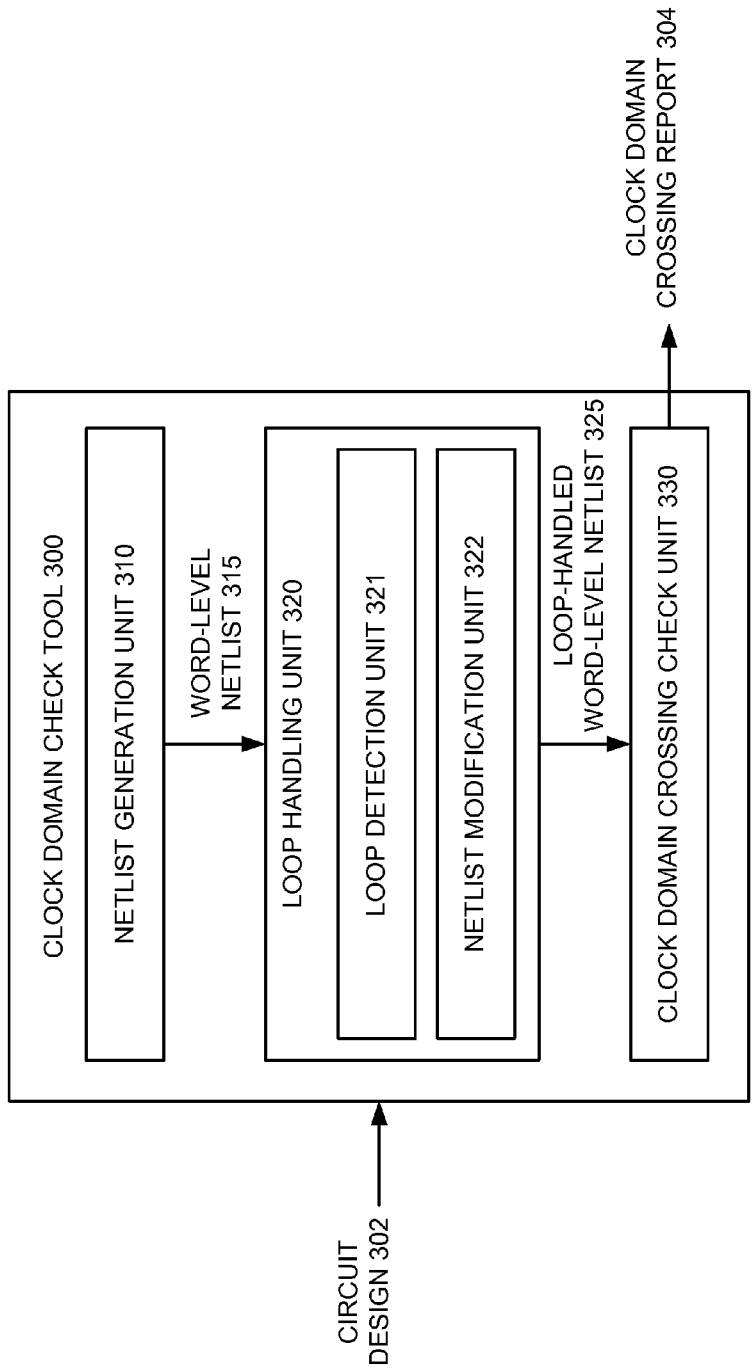
FIG. 3 illustrates an example of a clock domain crossing tool capable of handling loops in a word-level netlist implemented according to various embodiments of the invention.

FIG. 3 illustrates an example of a clock domain check tool 300 capable of handling loops in a word-level netlist 315 implemented according to various embodiments of the invention. Referring to FIG. 3, the clock domain check tool 300 can receive a circuit design 302 modeling an electronic device at a register transfer level (RTL), for example, with code in a hardware description language (HDL), such as Verilog, Very high speed integrated circuit Hardware Design Language (VHDL), or the like. The circuit design 302 can describe the electronic device both in terms of an exchange of data signals between components in the electronic device, such as hardware registers, flip-flops, combinational logic, or the like, and in terms of logical operations that can be performed on the data signals in the electronic device. In some embodiments, the clock domain check tool 300 can receive the circuit design 302 from a source external to the clock domain check tool 300, such as a user interface of the computing device 101, another tool implemented by the computing device 101, or the clock domain check tool 300 may internally generate the circuit design 302.

The clock domain check tool 300 can include a netlist generation unit 310 to convert the circuit design 302 into a word-level netlist 315. The word-level netlist 315 can describe the electronic device as groups of logical expressions along with their associated connectivity. In some embodiments, the word-level netlist can be implemented in a directed graph having nodes corresponding to expressions in the word-level netlist 315 and edges or arcs corresponding to directional inputs and directional outputs of the various expressions in the word-level netlist 315.

The clock domain check tool 300 can include a loop handling unit 320 to detect one or more combinational loops in the word-level netlist 315. When one or more combinational loops have been detected in the word-level netlist, 315, the loop handling unit 320 can modify the word-level netlist 315, for example, corresponding to the detected combinational loops. This modification of the word-level netlist 315 can generate a loop-handled word-level netlist 325, which can be output from the loop handling unit 320 for further utilization by the clock domain check tool 300. In some embodiments, when the loop handling unit 320 does not modify the word-level netlist 315, the loop handling unit 320 can output the word-level netlist 315 received from the netlist generation unit 310 as the loop-handled word-level netlist 325.

The loop handling unit 320 can include a loop detection unit 321 to detect one or more combinational loops in the word-level netlist 315, for example, by converting the word-level netlist 315 or selected portion(s) thereof into a bit-level representation and determining whether the bit-level representation includes at least one bit-accurate loop. The loop detection unit 321 can identify a presence of a combinational loop in the word-level netlist 315 when the bit-level representation implements a bit-accurate loop.

Since the conversion of the word-level netlist 315 into its corresponding bit-level representation can be time and resource intensive, the loop detection unit 321 can identify portions of the word-level netlist 315 having loop characteristics and convert those portions into a bit-level representation rather than the entire word-level netlist 315. In some embodiments, the loop detection unit 321 can identify the portions of the word-level netlist 315 having loop characteristics by computing strongly connected components within the word-level netlist 315, for example, utilizing Tarjan's strongly connected component algorithm, Kosaraju's strongly connected component algorithm, a path-based strong component algorithm, or the like. The strongly connected components can correspond to expression-level loops in the word-level netlist 315, for example, with expression nodes being reachable by the other expression node(s) in a common strongly connected component.

Figure 4:
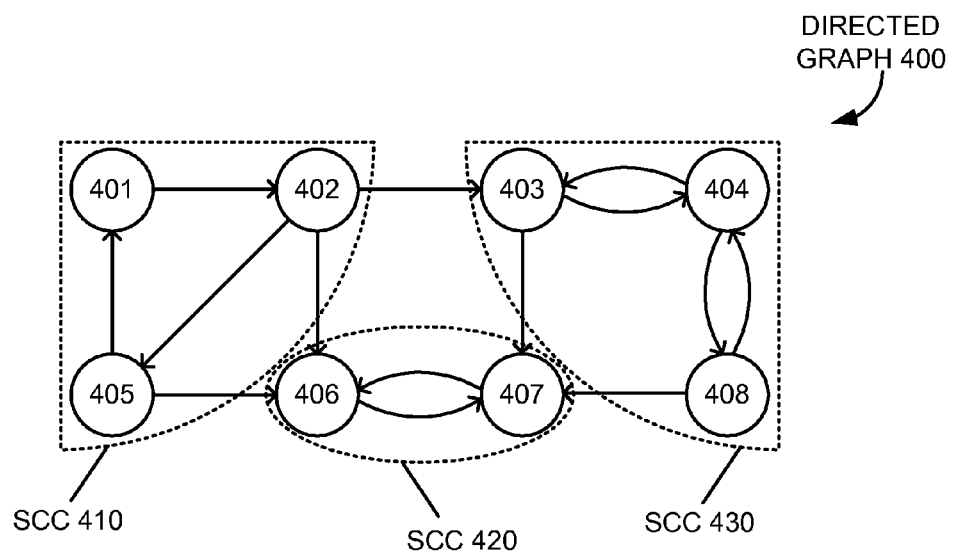
FIG. 4 illustrates an example of strongly connected components (SCCs) in a directed graph according to various embodiments of the invention.

FIG. 4 illustrates an example of strongly connected components (SCCs) in a directed graph 400 according to various embodiments of the invention. Referring to FIG. 4, a directed graph 400 can include multiple nodes 401-408 and directional arcs to describe connectivity between the multiple nodes 401-408. In some embodiments, when the directed graph 400 corresponds to a word-level netlist, such as word-level netlist 315 shown in FIG. 3, the nodes of the directed graph 400 can correspond to expressions in the word-level netlist and the arcs can correspond to directional inputs and directional outputs of the expressions.

The directed graph 400 can include multiple strongly connected components 410-430, which can each include multiple nodes having directional arcs that form a feedback path through their respective nodes. These feedback paths in the strongly connected components 410-430 have the characteristics of loops in the directed graph 400. For example, the strongly connected component 410 can include nodes 401, 402 and 405, which can have a feedback path from node 401 to node 402 to node 405 and then back to node 401. Since this path feeds through the nodes 401, 402, and 405, those three nodes form a strongly connected component. Similarly, the directed graph 400 can include the strongly connected component 420 having nodes 406 and 407, and include the strongly connected component 430 having nodes 403, 404, and 408.

Referring back to FIG. 3, the loop detection unit 321 can selectively convert portions of the word-level netlist 315 corresponding to the expression-level loops, such as the computed strongly connected component(s) or portions thereof, into bit-level representations. In some embodiments, the loop detection unit 321 can bit-blast the computed strongly connected component(s) or portions thereof, which converts them into bit-level circuit representations. The loop detection unit 321 can determine whether the bit-level representations implement at least one bit-accurate loop, for example, by computing strongly connected components within the bit-level representations. The loop detection unit 321 can detect a combinational loop in a portion of the word-level netlist 315 based on an identification of a strongly connected component in the bit-level representation of that portion of the word-level netlist 315.

The loop handling unit 320 can include a netlist modification unit 322 to modify the word-level net list 315 based, at least in part, on the detection of the one or more combination loops in the word-level netlist 315. In some embodiments, the netlist modification unit 322 can modify the word-level net list 315 by replacing a portion of the word-level netlist 315 corresponding to each detected combinational loop with a description of a different structure, such as a loop buffer, or the like, which may be easier to traverse than the detected combinational loop. The netlist modification unit 322 also can annotate the word-level netlist 315, for example, pointing out an existence of the detected combinational loops in the word-level netlist 315, one or more characteristics of the detected combination loops, or the like. The modified version of the word-level netlist 315 can correspond to a loop-handled word-level netlist 325.

The clock domain check tool 300 can include a clock domain crossing check unit 330 to perform one or more clock domain crossing checks on the loop-handled word-level netlist 325. For example, the clock domain crossing check unit 330 can perform one or more static checks, which can include a traversal of the loop-handled word-level netlist 325 to identify various clock domains in the circuit design 302. The clock domain crossing check unit 330 can analyze locations where different clock domains interface with each other, sometimes called clock domain crossing points, and determine of whether the circuit design 302 includes protection circuitry to synchronize signal exchanges between the clock domains at the locations. In some embodiments, the clock domain crossing check unit 330 also can augment the static checks with other verification processes, such as formal verification, simulation, emulation, or the like, for example, to verify operability of transfer protocols between clock domains, to identify delays through protection circuitry due to meta-stability, or the like. The clock domain crossing check unit 330 can generate a clock domain crossing report 304, for example, with results from the various clock domain crossing checks performed by the clock domain crossing check unit 330 on the loop-handled word-level netlist 325.

Figure 5:
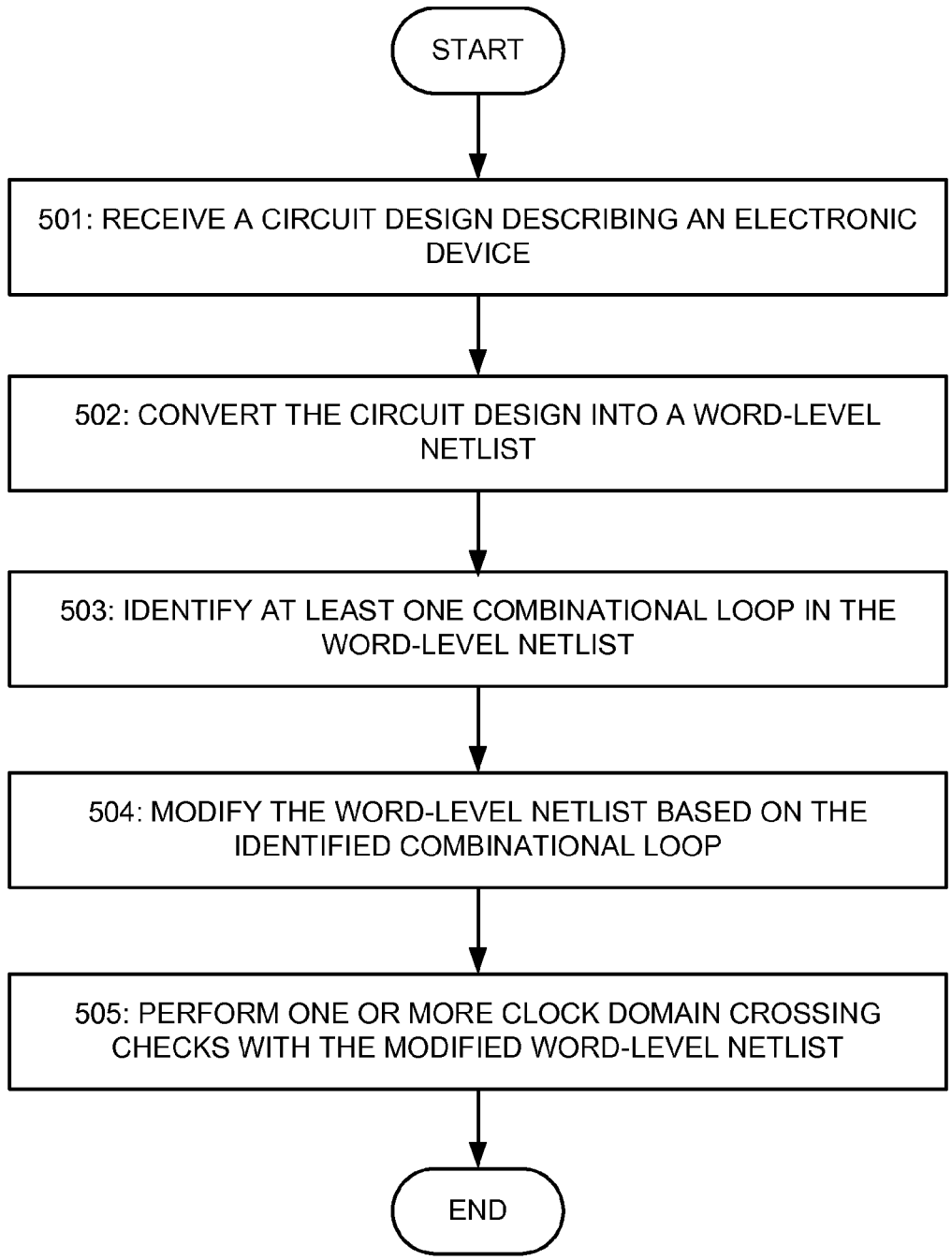
FIG. 5 illustrates a flowchart showing an example implementation of a clock domain crossing check for a circuit design a word-level netlist with combinational loop handling according to various examples of the invention.

FIG. 5 illustrates a flowchart showing an example implementation of a clock domain crossing check with combinational loop handling according to various examples of the invention. Referring to FIG. 5, in a block 501, a design verification tool, such as clock domain check tool 300 shown in FIG. 3, can receive a circuit design describing an electronic device, for example, both in terms of an exchange of data signals between components in the electronic device, such as hardware registers, flip-flops, combinational logic, or the like, and in terms of logical operations that can be performed on the data signals in the electronic device. The circuit design can model the electronic device at a register transfer level (RTL), for example, with code in a hardware description language (HDL), such as Verilog, Very high speed integrated circuit Hardware Design Language (VHDL), or the like.

In a block 502, the design verification tool can convert the circuit design into a word-level netlist, for example, by synthesizing or compiling the circuit design. The word-level netlist can describe the electronic device as groups of logical expressions and their associated connectivity. In some embodiments, the word-level netlist can be implemented in a directed graph having nodes corresponding to expressions in the word-level netlist and edges or arcs corresponding to directional inputs and directional outputs of the various expressions in the word-level netlist.

In a block 503, the design verification tool can identify at least one combinational loop in the word-level netlist. In some embodiments, the design verification tool can detect combinational loops in the word-level netlist by converting selected portions of the word-level netlist into a bit-level representation, and determining whether the bit-level representation of the word-level netlist includes a bit-accurate loop. The presence of a bit-accurate loop in the bit-level representation of the word-level netlist can indicate that the word-level netlist includes a combination loop corresponding to the bit-accurate loop. In some embodiments, the design verification tool can select the portions of the word-level netlist to convert into bit-level representations based on a presence of loop characteristics, such as an expression-level loop, in the portions of the word-level netlist.

In a block 504, the design verification tool can modify the word-level netlist based on the identified combinational loop. In some embodiments, the design verification tool can modify the word-level net list by replacing a portion of the word-level netlist corresponding to each detected combinational loop with a description of a different structure, such as a loop buffer, or the like, which may be easier to computationally traverse than the detected combinational loop. The design verification tool also can annotate the word-level netlist, for example, pointing out an existence of the detected combinational loops in the word-level netlist, one or more characteristics of the detected combination loops, or the like.

In a block 505, the design verification tool can perform one or more clock domain crossing checks with the modified word-level netlist. For example, the design verification tool may be configured to perform one or more clock domain checks on the modified word-level netlist. In some embodiments, the clock domain checks can include one or more static checks, which can include a traversal of the modified word-level netlist to identify various clock domains in the circuit design. The clock design verification tool can analyze locations where different clock domains interface with each other, sometimes called clock domain crossing points, and determine of whether the circuit design includes protection circuitry to synchronize signal exchanges between the clock domains at the locations. In some embodiments, the design verification tool also can augment the static checks with other verification processes, such as formal verification, simulation, emulation, or the like, for example, to verify operability of transfer protocols between clock domains, to identify delays through protection circuitry due to meta-stability, or the like.

Figure 6:
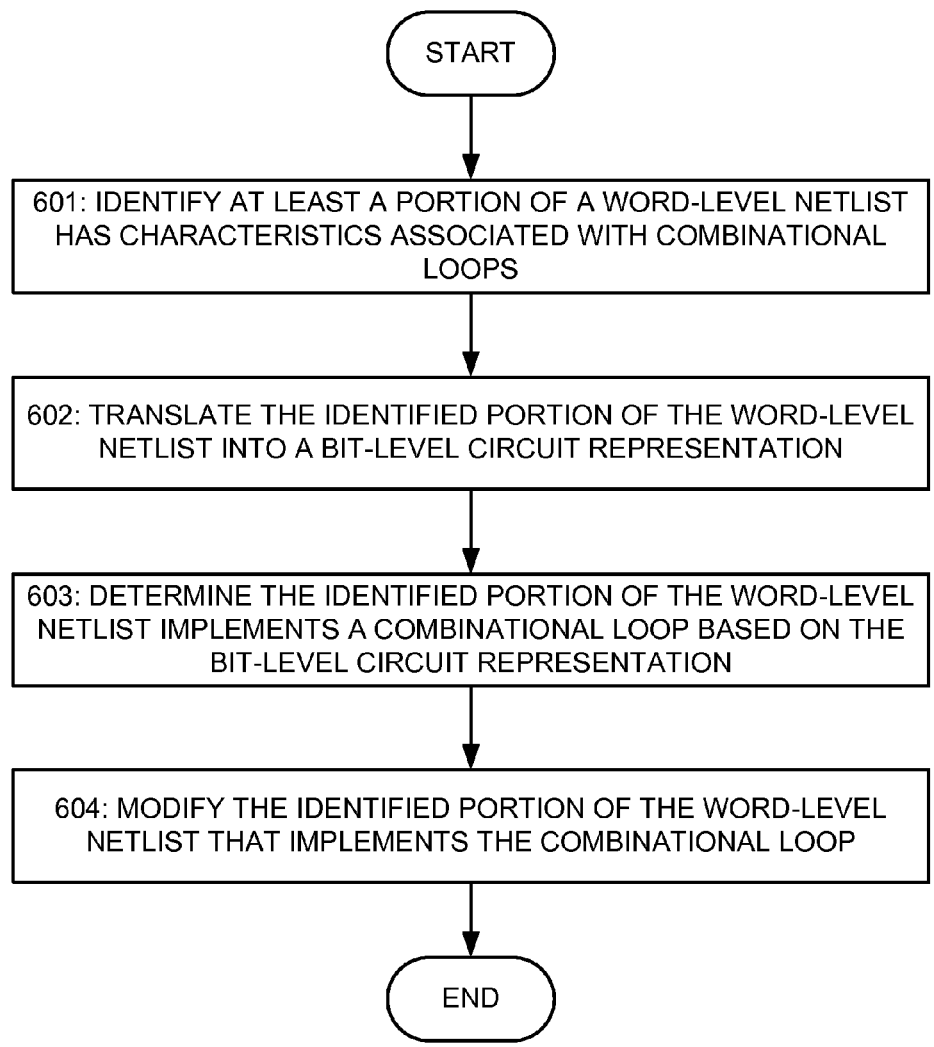
FIG. 6 illustrates a flowchart showing an example implementation of combinational loop handling according to various examples of the invention.

FIG. 6 illustrates a flowchart showing an example implementation of combinational loop handling according to various examples of the invention. Referring to FIG. 6, in a block 601, a design verification tool, such as clock domain check tool 300 shown in FIG. 3, can identify at least a portion of a word-level netlist has characteristics associated with combinational loops. In some embodiments, a presence of expression-level loops in the word-level netlist can correspond to the loop characteristics. The design verification tool can identify these expression-level loops in a variety of different ways, including through the use of a strongly connected component algorithm or process, which can compute strongly connected components in the word-level netlist. Each strongly connected component can correspond to one or more express-level loops in the word-level netlist.

In a block 602, the design verification tool can translate the identified portion of the word-level netlist into a bit-level circuit representation. In some embodiments, the design verification tool can generate the bit-level circuit representation by bit-blasting the identified portion of the word-level netlist.

In a block 603, the design verification tool can determine the identified portion of the netlist implements a combinational loop based on the bit-level circuit representation. The design verification tool can determine whether the bit-level circuit representation includes a bit-accurate loop, for example, through the use of a strongly connected component algorithm or process, which can compute strongly connected components in the bit-level circuit representation. Each strongly connected component in the bit-level circuit representation can correspond to one or more bit-accurate loops in the word-level netlist. Since an identification of a bit-accurate loop indicates a presence of a combinational loop in the word-level netlist, the design verification tool can determine the identified portion of the netlist implements a combinational loop based on the bit-level circuit representation.

In a block 604, the design verification tool can modify the identified portion of the netlist that implements the combinational loop. In some embodiments, the design verification tool can modify the identified portion of the word-level net list by replacing the identified portion of the word-level netlist corresponding to each detected combinational loop with a description of a different structure, such as a loop buffer, or the like, which may be easier to computationally traverse than the detected combinational loop. The design verification tool also can annotate the word-level netlist, for example, pointing out an existence of the detected combinational loops in the word-level netlist, one or more characteristics of the detected combination loops, or the like.

Figure 7:
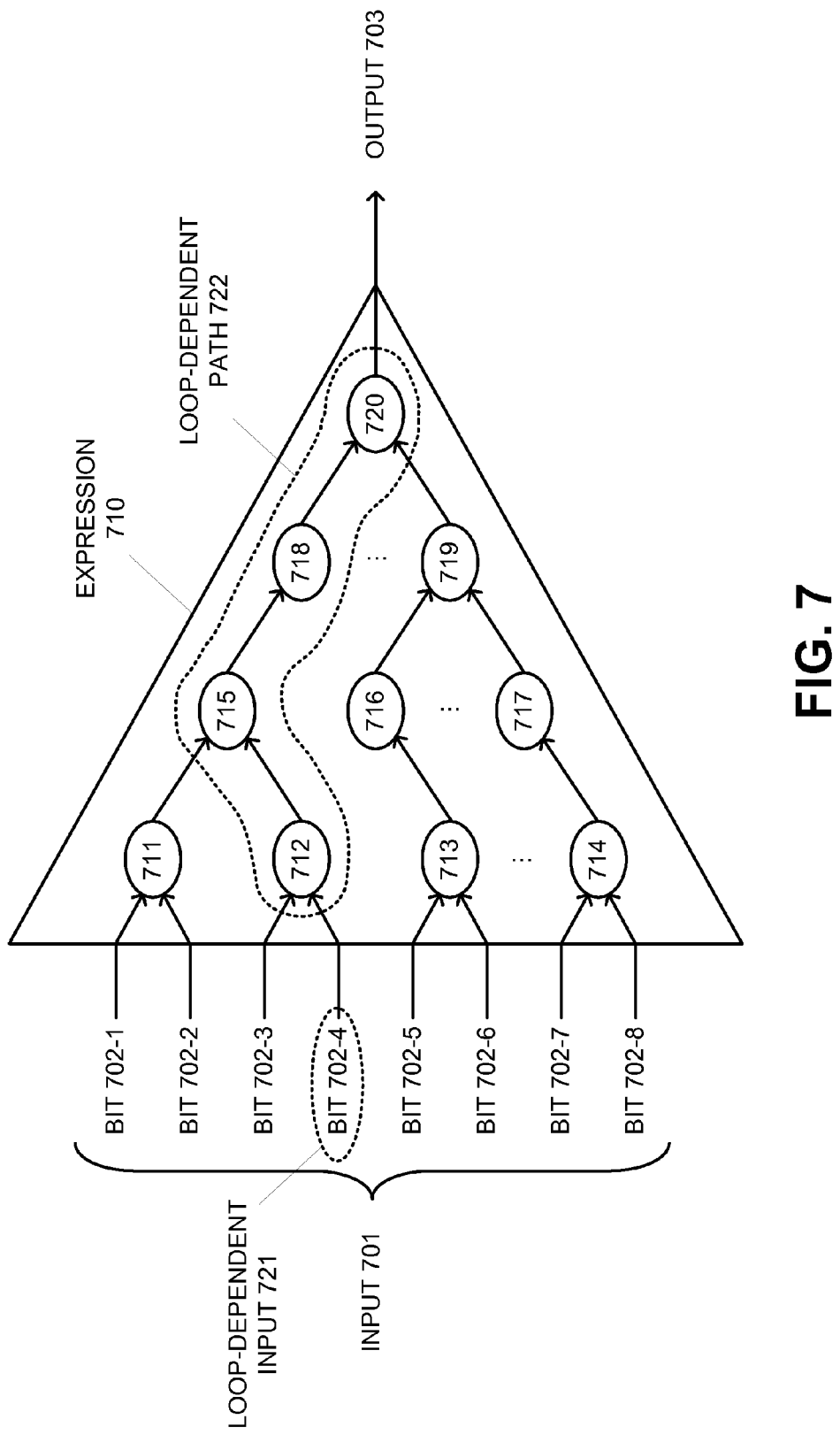
FIG. 7 illustrates an example of loop-dependent input-selective combinational loop handling according to various embodiments of the invention.

FIG. 7 illustrates an example of loop-dependent input-selective combinational loop handling according to various embodiments of the invention. Referring to FIG. 7, an expression 710 in an expression-level loop of a word-level netlist is shown. The expression 710 can generate an output 703 from an input 701 having bits 702-1 to 702-8 based on the functionality of the expression 710. The expression 710 can include multiple sub-expressions 711-720, coupled to implement the functionality of the expression 710. Although FIG. 7 shows the input 701 having eight bits and the expression 710 including 10 sub-expressions 711-720, this is merely illustrative. In some embodiments, expressions in the expression-level loop can receive input(s) with any number of bits and include any number of sub-expressions variously interconnected to provide an output based on the input(s).

A design verification tool can analyze the expression 710 in the expression-level loop to identify which input bits 702-1 to 702-8 to the expression 710 implements at least a portion of the expression-level loop. In this illustrative example, input bit 702-4 can implement at least a portion of the expression-level loop and thus can be identified as a loop-dependent input 721. The design verification tool can utilize the loop-dependent input 721 to identify a loop-dependent path 722 in the expression 710. The loop-dependent path 722 can correspond to a path through the expression 710 having an output controlled at least in part by the loop-dependent input 721. The loop-dependent path 722 can include one or more of the sub-expressions 711-720 of the expression 710, such as sub-expressions 712, 715, 718, and 720, which can provide a path from the loop-dependent input 721 to the output 703.

The design verification tool, when attempting to identify combinational loops in the word-level netlist, can selectively bit-blast the loop-dependent path 722 in the expression 710 rather than bit-blasting the entire expression 710. By identifying input bit(s) of the expression 710 that implement a portion of the expression-level loop and the corresponding sub-expressions in the expression 710 affected by the identified input bit(s), the design verification tool can selectively bit-blast a portion of the expression 710 in the expression-level loop of the word-level netlist. This selective bit-blasting can help reduce processing time and resources, while retaining the ability to effectively detect combinational loops in the word-level netlist.

Figure 8:
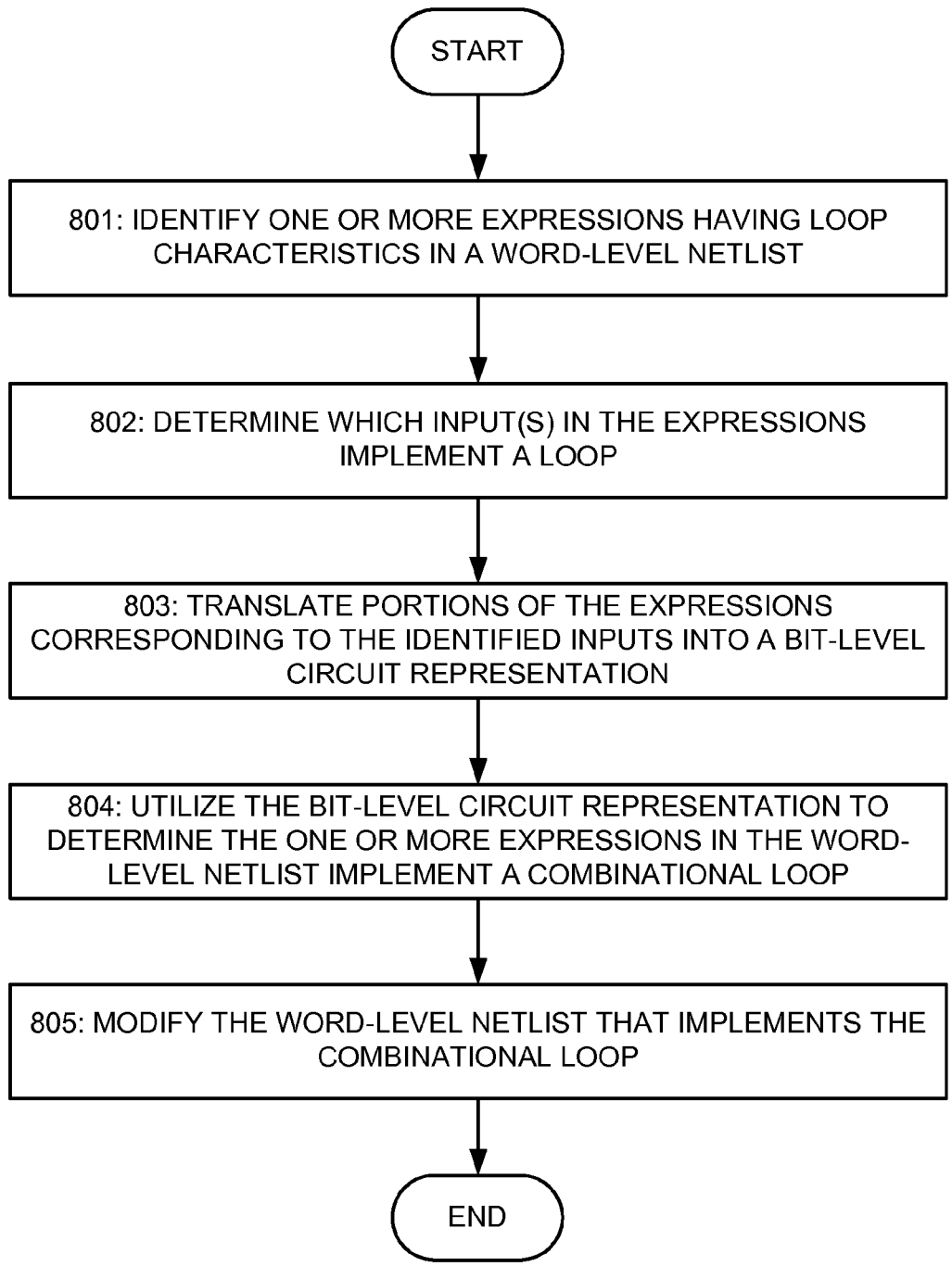
FIG. 8 illustrates a flowchart showing an example implementation of input-selective combinational loop handling according to various examples of the invention.

FIG. 8 illustrates a flowchart showing an example implementation of input-selective combinational loop handling according to various examples of the invention. Referring to FIG. 8, in a block 801, a design verification tool, such as clock domain check tool 300 shown in FIG. 3, can identify one or more expressions having loop characteristics in a netlist. Since expressions within expression-level loops having the loop characteristics, the design verification tool can identify expression-level loops in the word-level netlist, for example, by computing strongly connected components in the word-level netlist, and then identify the expressions in the expression-level loops.

In a block 802, the design verification tool can determine which input(s) in the expressions implement a loop. For example, the design verification tool can review the expression-level loops or strongly connected components in the word-level netlist to determine which expression outputs and inputs implement the expression-level loops.

In a block 803, the design verification tool can translate portions of the expressions corresponding to the identified inputs into a bit-level circuit representation. In some embodiments, the design verification tool can bit-blast the portions of the expressions corresponding to the identified inputs, converting the portions into a bit-level circuit representation.

As discussed above, since bit-blasting or otherwise converting a word-level netlist into a bit-level representation can be a time and resource consuming process, the ability of the design verification tool to avoid having to bit-blast or otherwise convert any portion of the word-level netlist into a bit-level representation can improve system performance. By identifying portions of expressions that implement expression-level loops, the design verification tool can reduce a total amount of the word-level netlist to bit-blast or otherwise convert into a bit-level representation, while still retaining the ability to effectively identify combinational loops in the word-level netlist.

In a block 804, the design verification tool can utilize the bit-level circuit representation to determine the one or more expressions in the netlist implement a combinational loop. The design verification tool can determine whether the bit-level circuit representation includes a bit-accurate loop, for example, through the use of a strongly connected component algorithm or process, which can compute strongly connected components in the bit-level circuit representation. Each strongly connected component in the bit-level circuit representation can correspond to one or more bit-accurate loops in the word-level netlist. Since an identification of a bit-accurate loop indicates a presence of a combinational loop in the word-level netlist, the design verification tool can determine the identified portion of the netlist implements a combinational loop based on the bit-level circuit representation.

In a block 805, the design verification tool can modify the netlist that implements the combinational loop. In some embodiments, the design verification tool can modify the identified portion of the word-level net list by replacing the identified portion of the word-level netlist corresponding to each detected combinational loop with a description of a different structure, such as a loop buffer, or the like, which may be easier to computationally traverse than the detected combinational loop. The design verification tool also can annotate the word-level netlist, for example, pointing out an existence of the detected combinational loops in the word-level netlist, one or more characteristics of the detected combination loops, or the like.

The system and apparatus described above may use dedicated processor systems, micro controllers, programmable logic devices, microprocessors, or any combination thereof, to perform some or all of the operations described herein. Some of the operations described above may be implemented in software and other operations may be implemented in hardware. Any of the operations, processes, and/or methods described herein may be performed by an apparatus, a device, and/or a system substantially similar to those as described herein and with reference to the illustrated figures.

The processing device may execute instructions or "code" stored in memory. The memory may store data as well. The processing device may include, but may not be limited to, an analog processor, a digital processor, a microprocessor, a multi-core processor, a processor array, a network processor, or the like. The processing device may be part of an integrated control system or system manager, or may be provided as a portable electronic device configured to interface with a networked system either locally or remotely via wireless transmission.

The processor memory may be integrated together with the processing device, for example RAM or FLASH memory disposed within an integrated circuit microprocessor or the like. In other examples, the memory may comprise an independent device, such as an external disk drive, a storage array, a portable FLASH key fob, or the like. The memory and processing device may be operatively coupled together, or in communication with each other, for example by an I/O port, a network connection, or the like, and the processing device may read a file stored on the memory. Associated memory may be "read only" by design (ROM) by virtue of permission settings, or not. Other examples of memory may include, but may not be limited to, WORM, EPROM, EEPROM, FLASH, or the like, which may be implemented in solid state semiconductor devices. Other memories may comprise moving parts, such as a known rotating disk drive. All such memories may be "machine-readable" and may be readable by a processing device.

Operating instructions or commands may be implemented or embodied in tangible forms of stored computer software (also known as "computer program" or "code"). Programs, or code, may be stored in a digital memory and may be read by the processing device. "Computer-readable storage medium" (or alternatively, "machine-readable storage medium") may include all of the foregoing types of memory, as well as new technologies of the future, as long as the memory may be capable of storing digital information in the nature of a computer program or other data, at least temporarily, and as long at the stored information may be "read" by an appropriate processing device. The term "computer-readable" may not be limited to the historical usage of "computer" to imply a complete mainframe, mini-computer, desktop or even laptop computer. Rather, "computer-readable" may comprise storage medium that may be readable by a processor, a processing device, or any computing system. Such media may be any available media that may be locally and/or remotely accessible by a computer or a processor, and may include volatile and non-volatile media, and removable and non-removable media, or any combination thereof.

A program stored in a computer-readable storage medium may comprise a computer program product. For example, a storage medium may be used as a convenient means to store or transport a computer program. For the sake of convenience, the operations may be described as various interconnected or coupled functional blocks or diagrams. However, there may be cases where these functional blocks or diagrams may be equivalently aggregated into a single logic device, program or operation with unclear boundaries.

CONCLUSION

While the application describes specific examples of carrying out embodiments of the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

One of skill in the art will also recognize that the concepts taught herein can be tailored to a particular application in many other ways. In particular, those skilled in the art will recognize that the illustrated examples are but one of many alternative implementations that will become apparent upon reading this disclosure.

Although the specification may refer to "an", "one", "another", or "some" example(s) in several locations, this does not necessarily mean that each such reference is to the same example(s), or that the feature only applies to a single example.

The invention claimed is:

1. A method comprising:
   detecting, by a computing system, a presence of a combinational loop in a word-level netlist representation of a circuit design by identifying a portion of the word-level netlist having at least one characteristic associated with the combinational loop, translating the identified portion of the word-level netlist into a bit-level circuit representation, and utilizing the bit-level circuit representation to determine the identified portion of the word-level netlist includes the combinational loop; and
   modifying, by the computing system, the word-level netlist corresponding to the detected presence of the combinational loop.

2. The method of claim 1, wherein modifying the word-level netlist further comprises replacing the identified portion of the word-level netlist that includes the combinational loop with a loop buffer element.

3. The method of claim 1, wherein modifying the word-level netlist further comprises annotating the word-level netlist to annunciate the presence of the combinational loop included in the identified portion of the word-level netlist.

4. The method of claim 1, wherein identifying the portion of the word-level netlist having the at least one characteristic associated with the combinational loop further comprises computing a strongly connected component in the word-level netlist, the strongly connected component corresponding to the identified portion of the word-level netlist having the at least one characteristic associated with the combinational loop.

5. The method of claim 4, wherein translating the identified portion of the word-level netlist into the bit-level circuit representation further comprises performing bit-blasting operations on the strongly connected component to generate the bit-level circuit representation.

6. The method of claim 4, wherein detecting the presence of the combinational loop in the word-level netlist further comprising identifying at least one input of the strongly connected component utilized to implement the combinational loop, and wherein translating the identified portion of the word-level netlist into the bit-level circuit representation further comprises performing bit-blasting operations on a portion of the strongly connected component corresponding to the at least one input, which generates the bit-level circuit representation.

7. The method of claim 1, wherein utilizing the bit-level circuit representation to determine whether the identified portions of the word-level netlist implement the combinational loop further comprises computing a strongly connected component in the bit-level circuit representation, wherein a presence of the strongly connected component in the bit-level circuit representation indicates the identified portion of the word-level netlist implements the combinational loop.

8. An apparatus comprising at least one computer-readable memory device storing instructions configured to cause one or more processing devices to perform operations comprising:
   detecting a presence of a combinational loop in an expression netlist representation of a circuit design by identifying a portion of the expression netlist having at least one characteristic associated with the combinational loop, translating the identified portion of the expression netlist into a bit-level circuit representation, and utilizing the bit-level circuit representation to determine the identified portion of the expression netlist includes the combinational loop; and modifying the expression netlist corresponding to the detected presence of the combinational loop.

9. The apparatus of claim 8, wherein modifying the expression netlist further comprises replacing the identified portion of the expression netlist that includes the combinational loop with a loop buffer element.

10. The apparatus of claim 8, wherein modifying the expression netlist further comprises annotating the expression netlist to annunciate the presence of the combinational loop included in the identified portion of the expression netlist.

11. The apparatus of claim 8, wherein identifying the portion of the expression netlist having the at least one characteristic associated with the combinational loop further comprises computing a strongly connected component in the expression netlist, the strongly connected component corresponding to the identified portion of the expression netlist having the at least one characteristic associated with the combinational loop.

12. The apparatus of claim 11, wherein translating the identified portion of the expression netlist into the bit-level circuit representation further comprises performing bit-blasting operations on the strongly connected component to generate the bit-level circuit representation.

13. The apparatus of claim 11, wherein detecting the presence of the combinational loop in the expression netlist further comprises identifying at least one input of the strongly connected component utilized to implement the combinational loop, and wherein translating the identified portions of the expression netlist into the bit-level circuit representation further comprises performing bit-blasting operations on a portion of the strongly connected component corresponding to the at least one input, which generates the bit-level circuit representation.

14. The apparatus of claim 8, wherein utilizing the bit-level circuit representation to determine whether the identified portions of the expression netlist implement the combinational loop further comprises computing a strongly connected component in the bit-level circuit representation, wherein a presence of the strongly connected component in the bit-level circuit representation indicates the identified portion of the expression netlist implements the combinational loop.

15. A system comprising:
a memory system configured to store computer-executable instructions; and
a computing system, in response to execution of the computer-executable instructions, is configured to:
detect a presence of a combinational loop in a word-level netlist representation of a circuit design by identifying a portion of the word-level netlist having at least one characteristic associated with the combinational loop, translating the identified portion of the word-level netlist into a bit-level circuit representation, and utilizing the bit-level circuit representation to determine the identified portion of the word-level netlist includes the combinational loop; and
modify the word-level netlist corresponding to the detected presence of the combinational loop.

16. The system of claim 15, wherein the computing system, in response to execution of the computer-executable instructions, is further configured to modify the word-level netlist by replacing the identified portion of the word-level netlist that includes the combinational loop with a loop buffer element.

17. The system of claim 15, wherein the computing system, in response to execution of the computer-executable instructions, is further configured to modify the word-level netlist by annotating the word-level netlist to annunciate the presence of the combinational loop included in the identified portion of the word-level netlist.

18. The system of claim 15, wherein identifying the portion of the word-level netlist having the at least one characteristic associated with the combinational loop further comprises computing a strongly connected component in the word-level netlist, the strongly connected component corresponding to the identified portion of the word-level netlist having the at least one characteristic associated with the combinational loop.

19. The system of claim 18, wherein translating the identified portion of the word-level netlist into the bit-level circuit representation further comprises performing bit-blasting operations on the strongly connected component to generate the bit-level circuit representation.

20. The system of claim 15, wherein utilizing the bit-level circuit representation to determine the identified portion of the word-level netlist implement the combinational loop further comprises computing a strongly connected component in the bit-level circuit representation, wherein a presence of the strongly connected component in the bit-level circuit representation indicates the identified portion of the word-level netlist includes the combinational loop.

* * * * *